(12) United States Patent
Duncan et al.

(10) Patent No.: US 6,756,781 B2
(45) Date of Patent: Jun. 29, 2004

(54) SENSOR FOR OPTICALLY MEASURING MAGNETIC FIELDS

(75) Inventors: Paul Grems Duncan, Vienna, VA (US); John Alan Schroeder, Leesburg, VA (US)

(73) Assignee: Airak, Inc., Manassas, VA (US)

( * ) Notice: Subject to any disclaimer, the term of this patent is extended or adjusted under 35 U.S.C. 154(b) by 25 days.

(21) Appl. No.: 10/294,905

(22) Filed: Nov. 15, 2002

(65) Prior Publication Data

US 2003/0146748 A1 Aug. 7, 2003

Related U.S. Application Data

(60) Provisional application No. 60/331,385, filed on Nov. 15, 2001.

(51) Int. Cl.[7] .......................... G01R 33/032; G02F 1/09
(52) U.S. Cl. .................................... 324/244.1; 359/484
(58) Field of Search ............................... 324/244.1, 96; 359/280, 484

(56) References Cited

U.S. PATENT DOCUMENTS

| | | | |
|---|---|---|---|
| 3,697,151 A | * 10/1972 | Skolnick et al. | 359/484 |
| 5,202,629 A | 4/1993 | Seike et al. | 324/244.1 |
| 5,475,298 A | 12/1995 | Rogers | 324/96 |
| 6,160,396 A | 12/2000 | Itoh et al. | 324/244.1 |
| 6,297,625 B1 | 10/2001 | Bosselmann et al. | 324/96 |
| 6,370,288 B1 | 4/2002 | Itoh et al. | 385/12 |
| 6,404,190 B1 | 6/2002 | Itoh et al. | 324/244.1 |
| 6,437,885 B1 | 8/2002 | Duncan | 359/28 |
| 2001/0043064 A1 | 11/2001 | Bosselman | 324/300 |

OTHER PUBLICATIONS

Fischer and Jackson "A Common–Mode Optical Noise–Rejection Scheme for an Extrinsic Faraday Current Sensor," Meas. Sci. Technol. 7 (1996) 796–800.

Niewczas, Cruden, Michie, Madden and McDonald, "Vibration Compensation Technique for an Optical Current Transducer," Opt. Eng. 38(10) 1708–1714 (Oct. 1999).

Madden, Michie Cruden, Niewczas, and McDonald, "Temperature Compensation for Opitcal Current Sensors," Opt. Eng. 38(10) 1699–1707 (Oct. 1999).

Ulmer, Edward A., "A High–Accuracy Optical Current Transducer"IEEE, Transactions on Power Delivery, vol. 5, No. 2, Apr. 1990.

* cited by examiner

Primary Examiner—Walter E. Snow
(74) Attorney, Agent, or Firm—Greenberg Traurig, LLP; Richard E. Kurtz, II (57) ABSTRACT

Described are improved transmissive magneto-optical sensors that may be used to determine the magnitude and phase of a magnetic field surrounding a conductor, and when in contact with the conductor, the surface temperature of the conductor. The magneto-optical sensor may be made to be symmetric around the direction of propagation of the internal light, enabling ease of manufacturing as well as automated assembly and calibration. The magneto-optical sensor may also be made to be symmetric about the plane determined by the Faraday rotator material, thus enabling reciprocating optical paths for increased vibration and birefringence immunity. The disclosed sensors preferably include cylindrically symmetrical components, thereby making the sensor readily mass-producible.

27 Claims, 9 Drawing Sheets

SENSOR FOR OPTICALLY MEASURING MAGNETIC FIELDS

This application claims the benefit of U.S. patent application Ser. No. 60/331,385, filed Nov. 15, 2001, the entire disclosure of which is hereby incorporated herein by reference.

BACKGROUND OF THE INVENTION

1. Field of the Invention

The invention relates in general to optical sensors that detect the Faraday effect in crystal media, and more specifically, the class of transmissive optical sensors that rotate the plane of polarization of light traveling through a crystal media that is under the influence of external quantities such as magnetic fields, electrical currents which give rise to magnetic fields, or temperature fluctuations.

2. Related Art

More than 150 years ago, Michael Faraday discovered that when linearly polarized light travels through flint glass that is exposed to a magnetic field, its plane of polarization rotated. This property, now known as the Faraday effect, is widely used in the fiber optic telecommunications field, specifically to prevent reflected light energy from coupling back into a light source and changing source parameters such as frequency or power output. In sensor systems that exploit the Faraday effect, a sensor assembly is placed into a magnetic field. By monitoring the rotation of the incident polarization state, a direct measurement of the magnetic field intensity can be inferred. The relationship governing this phenomenon is best stated as:

$$\Theta = VHl \quad \text{EQN}(1)$$

where $\Theta$ is the measured angle of rotation of the field, V is a constant known as Verdet's constant, H is the applied magnetic field, and l is the optical path length. All materials exhibit the Faraday effect, but the magnitude varies greatly. For example, the Verdet constant for a $SiO_2$ crystal is approximately 3.2e−4 (deg/cm-Oe), while in ferromagnets such as the value can be on the order of 6.0e+5 (deg/cm-Oe).

When an optical path completely encircles a conductor, a numerical integration can be performed about the optical path, which results in the ability of relating the Faraday rotation directly to the current flowing through the optical path. In this instance, the rotation is related to current I by a form of Ampere's Law:

$$\Theta = V \oint H dl \quad \text{EQN}(2)$$

$$\Theta = VI \quad \text{EQN}(3)$$

Finally, if N optical paths exist around the conductor, the total current in the conductor is $$I = \frac{\Theta}{VN} \quad \text{EQN (4)}$$

Optical fiber is one material that exhibits a small Faraday effect. Based upon this, devices have been known and used for measuring the amount of current flowing through a conductor. By wrapping multiple turns of optical fiber around the conductor and applying Ampere's Law, the amount of current can be directly measured. Sensitivity is controlled in this fashion: applications requiring higher sensitivity wrap a higher number of turns around the conductor being monitored.

Unfortunately, using optical fiber as a sensor is often impractical in many applications because it is not feasible to interrupt power by disconnecting the conductor, installing the fiber coil assembly, then reconnecting the conductor. Another disadvantage of an all-fiber sensor is that in practical use, the loops that encircle the conductor can be no smaller than 4–5 cm in diameter. Violation of this condition typically results in tremendous temperature sensitivity, which then appears as an undesired rotation of the state of polarization of the desired signal.

Bulk glass is another material that exhibits a Faraday effect. An advantage of the use of bulk glass is that the sensor can be fabricated from materials with a higher Verdet constant, which improves the sensitivity to the influencing magnetic field. These bulk crystals can be annealed, which can release internal stresses, thereby reducing linear birefringence. By themselves, bulk-glass sensors are relatively mechanically stable in both temperature and mechanical handling. Bulk glass can be made relatively inexpensively, which portends well for mass production concepts using these sensors.

Bulk-glass sensors suffer from their own set of limitations. The transducers manufactured from bulk glass are large, relatively on the same order as the all-optical fiber sensors previously described. Bulk glasses are not ferromagnetic, hence their Verdet constants are lower, which restricts their applications to extremely high current measurement. Obtaining multiple circular paths around a bulk-glass arrangement in order to increase the sensitivity of the sensor has been accomplished by some researchers, but there are limitations of using this configuration in applications that experience tremendous temperature fluctuations. Finally, assembly and alignment of bulk-glass sensors has historically been performed by hand, resulting in tremendous labor costs that preclude their widespread use.

Ferromagnetic materials, such as bismuth- and terbium-doped yttrium-iron-garnet ($BiTb_2Y_3Fe_5O_{12}$) for example, have much larger Verdet constants per unit thickness. This results in a much smaller Faraday rotator to measure a given magnetic field strength, and the outcome is that a whole class of reduced size magneto-optical transducers is enabled. Methods to grow these materials are well established and directly support other markets, specifically optical telecommunications, hence tremendous economies of scale are realized that surpass that of bulk-glass and rival the cost of optical fiber. Packaging of the transducer becomes smaller with the introduction of high-Verdet constant materials, and thus manufacturing costs are significantly less than what is available with all-fiber or bulk-glass designs.

Applications for a reduce-sized magneto-optic transducer continue to grow. For example, the electric utility industry is experiencing tremendous pressures as consumer and regulatory demands upon the industry increase. Consumers, with expanding telecom, data processing, and other energy needs, are demanding "high-nines" reliability. Utilities are attempting to respond, but are doing so with an antiquated infrastructure that has an average age of 31 years. Regulatory pressures have created large uncertainties in the future ownership of assets, and hence infrastructure improvements have fallen sharply since the mid 1990's. Additionally, many utilities operate under rate caps and cannot pass costs onto consumers. Not surprisingly, the industry is looking to conserve capital, and is doing so by pushing equipment harder without fully understanding the long-term consequences, as well as deferring maintenance until corrective action is required. Even small percentage changes in distribution system operating efficiencies can result in hundreds of millions of dollars a year in savings. Hence, many utilities are reviewing technologies that can provide efficiency and reliability improvements.

Optical sensor technologies for utility applications promise to deliver lower-cost monitoring solutions to the industry. These technologies provide an entirely new means of measuring electrical current, conductor temperature, voltage, and combustible gasses. When combined with the latest wireless and network topologies, automated data delivery and control is possible, resulting in improved operations. Optical sensory systems which cost less than current state-of-the-art transformer-based systems gives utilities the key to unlocking information by which they can manage their systems much more efficiently, resulting in improved reliability and improved system efficiencies. Furthermore, widespread use of these technologies will result in the immediate notification and location of power faults and outages, potentially saving the utility industry and it's customers 100's of millions of dollars in outage costs.

U.S. Pub. No. US2001/0043064A1 to Bosselmann et al. discloses a pi-shaped transmissive polarimetric sensor that is comprised of a polarizer, a sensor element, and an analyzer. An output optical waveguide with a core diameter of at least 100 $\mu$m is used. The input light is uncollimated and unfocused. The sensor requires the use of a prism to steer the light from the input fiber to the sensor element, and correspondingly, from the sensor element to the output optical waveguide.

U.S. Pat. No. 6,404,190 (2002) to Itoh et al. discloses a pi-shaped transmissive polarimetric sensor that is comprised of an input optical fiber, a polarizer, a magneto-optical device, a second polarizer comprising an analyzer, and an output optical fiber. Itoh et al. present three embodiments: one that uses spherical or hemispherical lens at each of the fibers, one that omits the polarizers and uses fiber to provide the polarization/analyzer function, and one that uses plastic optical fiber.

U.S. Pat. No. 6,347,885 (2002) to Duncan discloses the use of rare-earth iron garnet magneto-optical films in reflection-type magneto-optical sensors as well as presenting several optical and signal processing topologies that can be used to measure the Faraday rotation due to a changing magnetic field.

U.S. Pat. No. 6,370,288 (2002) to Itoh et al. discloses a pi-shaped transmissive polarimetric sensor that is arranged as a confocal optical system comprised of a input optical fiber, a drum lens, a polarizer, a magneto-optical device, a second polarizer comprising an analyzer, a second drum lens, and an output optical fiber. In this disclosure, one holder contains both the input drum lens and the output drum lens.

U.S. Pat. No. 6,160,396 (2000) to Itoh et al. discloses a pi-shaped transmissive polarimetric sensor that is comprised of an input optical fiber, a first lens, a first mirror, a polarizer, a magneto-optical device, an analyzer, a second mirror, a second lens, and an output fiber. Integrated holders are used to hold the discrete optical components.

U.S. Pat. No. 5,861,741 (1999) to Itoh discloses a linear, transmissive polarimetric sensor that uses multimode optical fiber for the input and output fibers. Only one rod lens is used to couple the energy from the input fiber to the output fiber.

U.S. Pat. No. 5,742,157 (1998) to Ishizuka et al. discloses a pi-shaped transmissive polarimetric sensor that uses one GRIN lens to launch and recover the optical energy in a configuration similar to that disclosed by Itoh et al. in U.S. Pat No. 6,160,396.

U.S. Pat. No. 5,485,079 (1996) to Itoh discloses a linear, transmissive polarimetric sensor comprised of a first lens, a polarizer, a magneto-optical element, an analyzer, and a second lens. Itoh further discloses that this sensor system is a light converging optical system.

U.S. Pat. No. 5,475,298 (1995) to Rogers discloses a reciprocal optical system that dynamically compensates for external perturbations that change the properties of an optical wavefront traveling within an optical fiber.

U.S. Pat. No 5,321,258 (1994) to Kinney discloses a pi-shaped optical sensor unit that is capable of being manufactured as a small sensor package as a result of a novel housing used to align the magneto-optical sensing element with the incoming wavefront. The design eliminates the need for mirrors, prisms, or collimating lenses.

U.S. Pat. No. 5,202,629 (1993) to Seike et al. discloses a pi-shaped magneto-optical sensor having a magneto-optical element, a polarizer, an analyzer, and a substrate to which these elements are bonded. Seike et al. assert that the disclosed sensor is temperature stable from $-20°$ C. to $+80°$ C., and that this is due to a specialized synthetic resin that is used in the bonding process.

U.S. Pat. No. 5,008,611 (1991) to Ulmer, Jr. discloses a method and apparatus for measuring a target electric current utilizing the Faraday effect in an optical medium.

In "Vibration Compensation Technique for an Optical Current Transducer", Opt. Eng. 38(10), October 1999, pp 1708–1714, Niewczas et al. discuss a technique for compensation of vibration-induced noise in a optical current transducer. Their method uses two light sources as well as two photodetectors.

In "A High-Accuracy Optical Current Transducer for Electric Power Systems" Power Delivery, IEEE Transactions on, Volume: 5 Issue: 2 , April 1990 Page(s): 892–898, Ulmer, E. A., Jr. discusses the use of non-45 degree orientations between an incident polarizer and an accompanying analyzer.

In "A Common-Mode Optical Noise-Rejection Scheme for an Extrinsic Faraday Current Sensor", *Meas. Sci. Technol.* 7 No 5 (May 1996) pp. 796–800, Fisher, N E and Jackson, D A discuss a method to eliminate optical noise induced by fiber optic vibration. Their experiment utilizes a linear, non-reciprocal magneto-optical transducer that places a beam splitter directly onto the sensor assembly.

In "Improving the Sensitivity of a Faraday Current Sensor by Varying its Operating Point", *Meas. Sci. Technol.*__6 No 10 (October 1995) pp. 1508–1518, Fisher, N E and Jackson, D A discuss a method to improve the performance of a Faraday sensor. Their experiment utilizes a linear, non-reciprocal arrangement of a polarizer, Faraday rotator, and another polarizer, and they discuss the effect of varying the polarization angles between the two polarizers.

OBJECTS AND SUMMARY OF THE INVENTION

It is an object of the invention to provide an improved optical sensor for measuring polarization rotation of optical wavefronts.

It is a further object of the invention to provide an improved optical sensor for measuring the temperature of the sensor element as well as the temperature of the conductor in which the sensor is in contact.

It is a further object of the invention to provide an improved optical sensor that mechanically self-aligns the entire optical path during the manufacture of the device.

It is a further object of the invention to provide an improved optical sensor that can be used in reciprocal mode, e.g., with counter-propagating optical wavefronts simultaneously entering and leaving each fiber.

It is yet a further object of the invention to provide an improved optical sensor that can be easily mass-produced through automation, with minimization or complete elimination of the difficulties of alignment and characterization of the said optical components.

In a preferred embodiment, the invention provides optical sensors that use Faraday rotator materials, e.g., crystalline materials such as rare-earth garnets for example, as to measure magnetic fields, corresponding electrical currents, or temperature fluctuations. The invention may be provided in the form of a fiber optic sensor system preferably comprising an optical fiber coupled to a graded index (GRIN) lens, a polarizer, a Faraday rotator material, another polarizer, another GRIN lens coupled to an optical fiber, an optical detector, and an electronic circuit to analyze the output of the detector.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

DETAILED DESCRIPTION OF THE PREFERRED EMBODIMENTS

With reference to FIG. 1 through FIG. 9, the device in accordance with a preferred embodiment is a transmissive magneto-optical sensor that can be operated in either non-reciprocal mode or in reciprocal mode. In non-reciprocal mode, light only travels in one direction through the current sensor assembly 20, whereas in reciprocal mode light travels simultaneously in opposing directions through the sensor assembly 20. Non-reciprocal mode can be used to simplify signal processing and to reduce system cost, whereas reciprocal mode is used where higher measurement resolution or vibration immunity is the governing goals. In either mode, optical operation of the device is the same.

Figure 1:
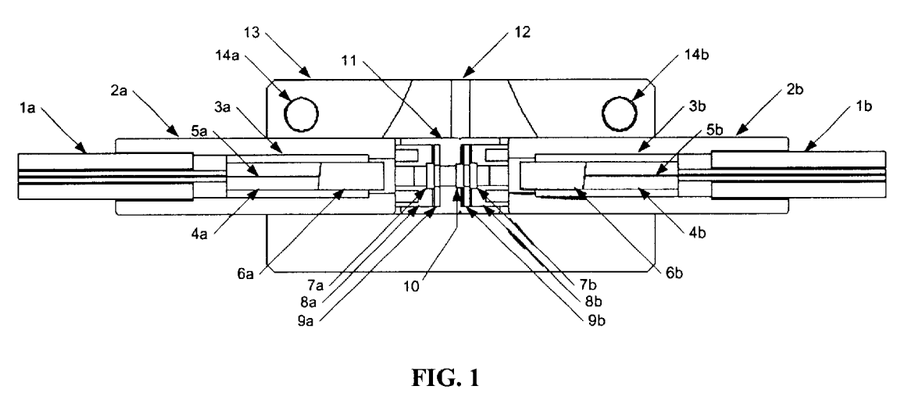
FIG. 1 shows a schematic of a fiber optic magneto-optic sensor assembly in accordance with a preferred embodiment of the invention.
Figure 2:
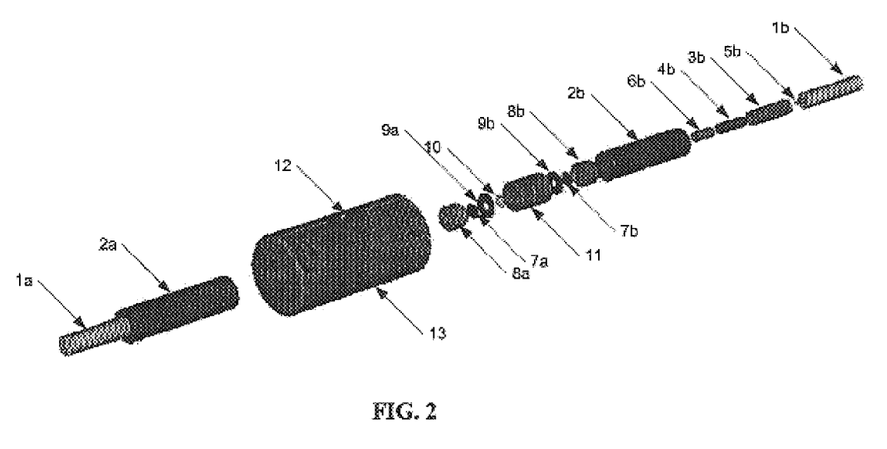
FIG. 2 shows an exploded view of components that make up the fiber optic magneto-optic sensor assembly.

The operation of the device in non-reciprocal mode is preferably as follows. An optical wavefront of light energy, such as that from a semiconductor laser, enters the current sensor assembly 20 through furcation tube 1a containing an internal optical fiber 5a. The optical fiber 5a may be held in place via capillary tubing 4a, and the capillary tubing 4a/optical fiber 5a may be optically bonded to a quarter-pitch graded index lens 6a, which serves to expand and collimate the input light beam. The capillary tubing 5a and graded index lens 6a may be held secure in the assembly by a hollow-core tube 3a and non-ferrous collimator outer housing 2a. The light is then projected through polarizer 7a, which can be held securely in place by retainer/adjuster 8a. This polarizer 7a establishes an arbitrary but fixed state of polarization for the incident optical wavefront.

The Faraday rotator material 10 can be held in a preferred orientation within the sensor assembly by the Faraday rotator material carrier 11 and locking pin 12. The Faraday rotator material carrier 11 is preferably hollow and is aligned with the propagating light wavefront from polarizer 7a. Situated between, and axially aligned with retainer/adjuster 8a and Faraday rotator material carrier 11 is a spacer 9a, which is used to slightly offset the polarizer 7a from the Faraday rotator material 10. The propagating light wavefront from polarizer 7a travels through spacer 9a, is incident upon the Faraday rotator material 10, and exits through the Faraday rotator material carrier 11. In the presence of a magnetic field this lightwave will undergo a rotation of the polarization state established by polarizer 7a. This rotation is proportional to the strength of the magnetic field intersecting the Faraday rotator material 10 in the same direction as the direction of the propagating lightwave.

The propagating light now passes through another spacer 9b, which may be positioned axially between the Faraday rotator material carrier 11 and another retainer/adjuster 8b. This retainer/adjuster 8b holds another polarizer 7b whose transmission axis is in the same plane as polarizer 7a but is rotationally offset by an amount that is established by the system configuration. This polarizer 7b serves to separate the polarization rotation induced by the Faraday rotator material 10 into a polarization component that varies the intensity of the propagating wavefront as a function of the applied magnetic field. The remaining components of the sensor 20 are preferably a mirror image of the assembly previously described. The collimated optical wavefront from polarizer 7b is incident upon the graded-index lens 6b and is refocused upon the optical fiber 5b. From here the light is sent down the optical fiber 5b and furcation tube 1b where it is eventually converted to an electric current by a photodiode 24 and then is processed by a semiconductor driver and electronics signal processing circuit 21. A second hollow-core tube 3b and second capillary tube 4b are preferably provided.

A sensor housing 13 may be provided, and preferably includes tensioning screws 14a, 14b and a through bore such that the inner diameter of the housing matches the outer diameter of the collimator outer housings 2a, 2b.

Figure 3:
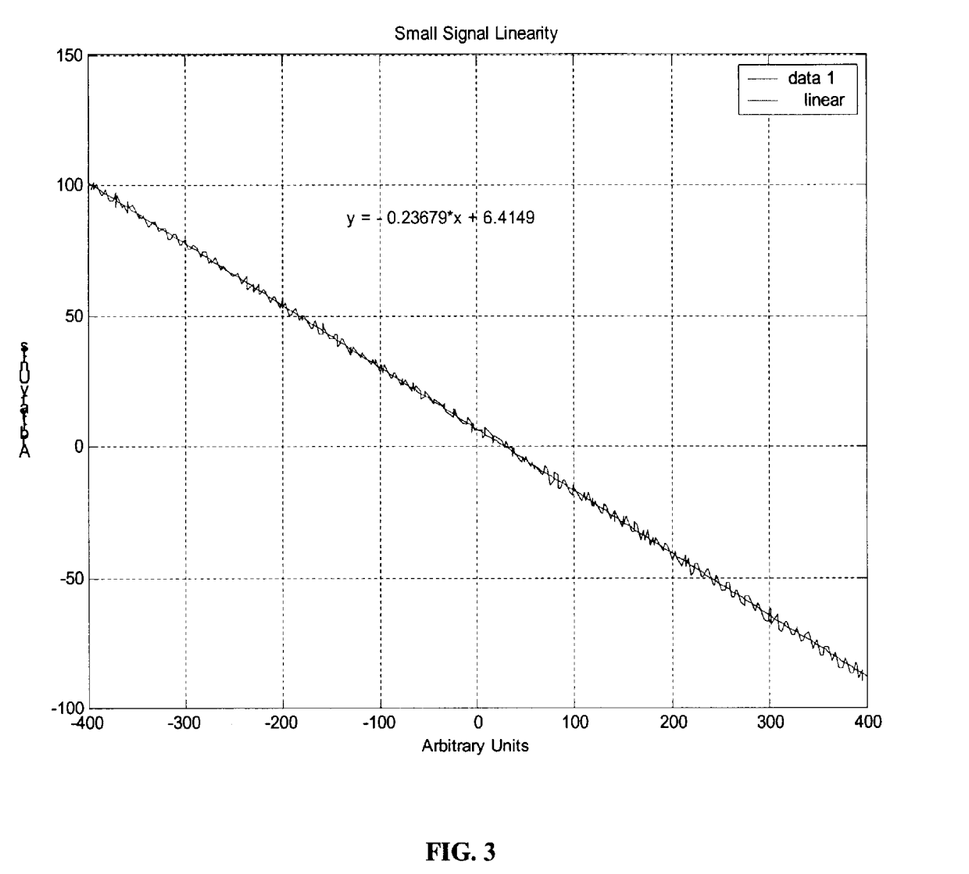
FIG. 3 shows a representative small-signal linearity of the magneto-optic sensor assembly in a 60-Hz, AC magnetic field.

FIG. 3 shows an example of a small-signal linearity of the transducer 20 with a 60-Hz sinusoidal excitation. As can be seen, the response of the transducer 20 is extremely linear for small variations in signal response, with a 0.99943 coefficient of correlation between the transducer output and a linear curve fit.

Figure 4:
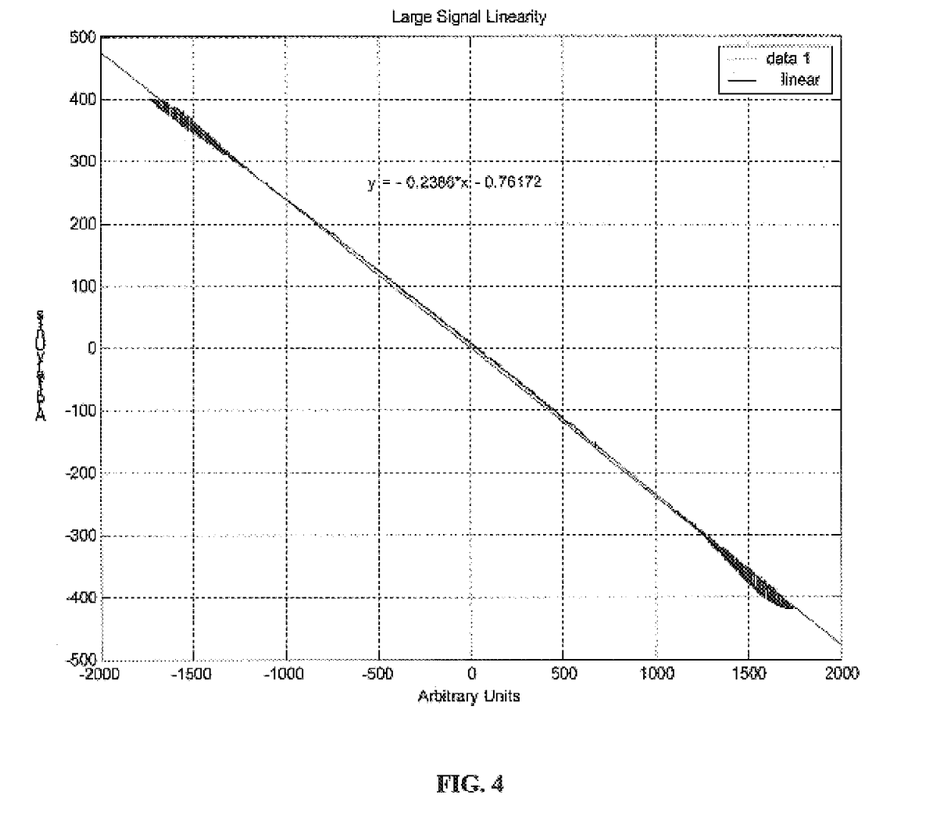
FIG. 4 shows a representative large-signal linearity of the magneto-optic sensor assembly in a 60-Hz, AC magnetic field.

FIG. 4 shows an example of a large-signal linearity of the transducer 20 with a 60-Hz sinusoidal excitation., As can be sent the response of the transducer 20 is linear, but as the magnitude of the excitation increases, a slight hysteresis develops. This is purely a function of the materials that comprise the Faraday rotator material 10 and in no way limit the usefulness of the transducer 20. The coefficient of correlation between the transducer output and a linear curve fit is 0.9936 for the representative data shown.

Figure 5:
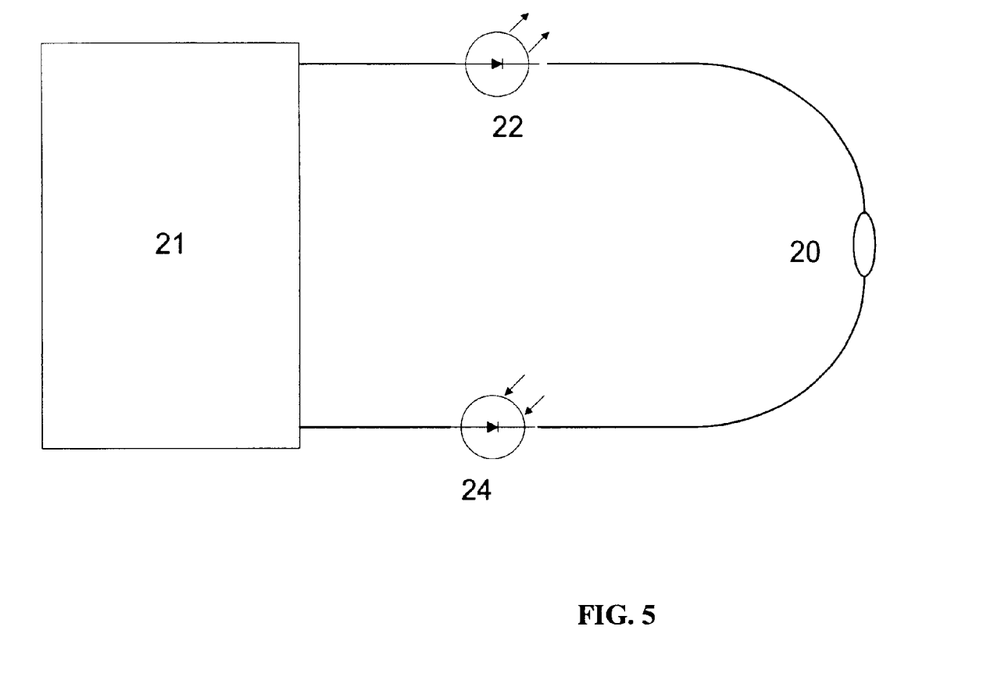
FIG. 5 shows a representative single-ended-schematic used to process magnetic field or temperature information and is comprised of a semiconductor driver, semiconductor light source, the magneto-optic sensor assembly, a single photodiode, and signal processing electronics.

FIG. 5 shows a non-reciprocal transmissive electro-optical system capable of measuring the polarization rotation of a magneto-optic sensor assembly 20. Light energy is generated by a semiconductor light source 22 and is transmitted via optical fiber to the transducer assembly 20. In the presence of a magnetic field that has a field component oriented with the direction of the propagation of the optical wavefront, the intensity output will vary in proportion to the intensity of the magnetic field component and will be detected by photodetector 24. The output of photodetector 24 is then processed by analog or digital signal processing electronics 21.

Figure 6:
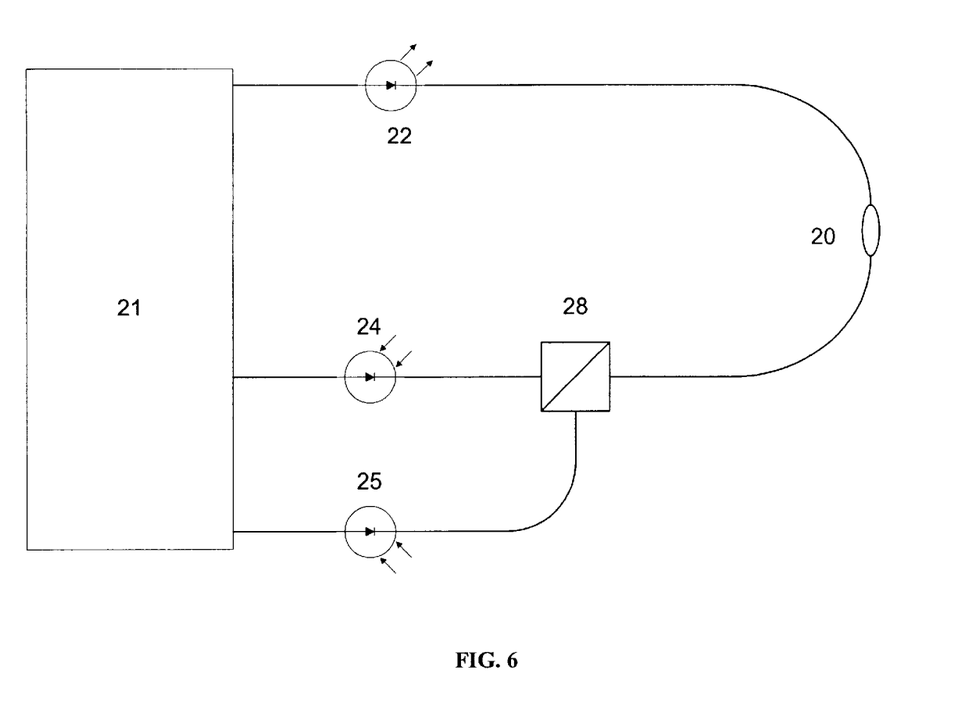
FIG. 6 shows a representative schematic used to process magnetic field or temperature information and is comprised of a semiconductor driver, a semiconductor light source, the magneto-optic sensor assembly, a polarizing beamsplitter, dual photodiodes, and signal processing electronics.

FIG. 6. shows a non-reciprocal transmissive electro-optical system capable of measuring the polarization rotation of magneto-optical sensor assembly 20. Light energy is generated by a semiconductor light source 22 and is transmitted via optical fiber to the transducer assembly 20. In the presence of a magnetic field that has a field component oriented with the direction of the propagation of the optical wavefront, the intensity output of the transducer 20 will vary in proportion to the intensity of the magnetic field component. Polarizing beamsplitter 28 serves the purpose of separating the incident optical wavefront into two orthogonal components. The separated outputs of polarizing beamsplitter are then incident upon two independent photodiodes 24 and 25, which are then processed by analog or digital signal processing electronics 21.

In the system configuration of FIG. 6. if the incident optical wavefront is connected to the input fiber 5a, it is not necessary to utilize polarizer 7b in transducer assembly 20 as this polarization analyzing function is accomplished in polarization beamsplitter 28.

Figure 7:
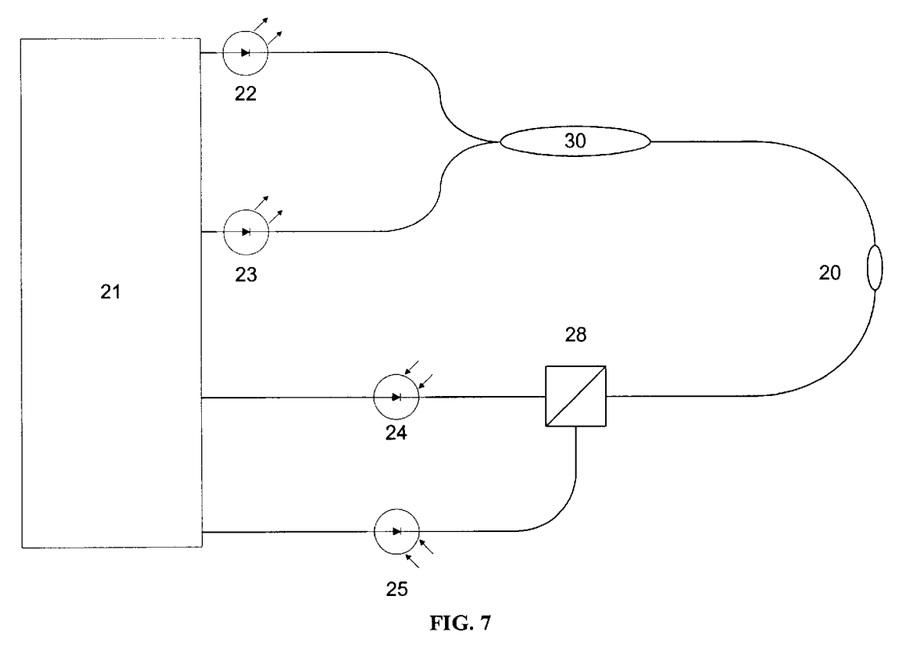
FIG. 7 shows a representative schematic used to process temperature and magnetic field information and is comprised of a semiconductor driver, dual semiconductor light sources, a fiber optic coupler, the magneto-optic sensor assembly, a polarizing beamsplitter, dual photodiodes, and signal processing electronics.

FIG. 7. shows a non-reciprocal transmissive electro-optical system capable of simultaneously measuring the polarization rotation of magneto-optical sensor assembly 20 due to the influence of magnetic fields and variations in temperature. Light energy is alternately generated by semiconductor light sources 22 and 23 and is coupled into the same transmission path is transmitted via an optical coupler 55 30. The optical coupler 30 is connected via optical fiber to the transducer assembly 20. In the presence of a magnetic field that has a field component oriented with the direction of the propagation of the optical wavefront, or in the presence of a temperature fluctuation affecting the Faraday rotator material 10, the intensity output of the transducer 20 will vary in proportion to the intensity of the magnetic field component or change in temperature of the Faraday rotator material 10. Polarizing beamsplitter 28 serves the purpose of separating the incident optical wavefront into two orthogonal components. The separated outputs of polarizing beamsplitter are then incident upon two independent photodiodes 24 and 25, which are then processed by analog or digital signal processing electronics 21.

In the system configuration of FIG. 7. if the incident optical wavefront is connected to the input fiber 5a, it is not necessary to utilize polarizer 7b in transducer assembly 20 as this polarization analyzing function is accomplished in polarization beamsplitter 28. Furthermore, the dual-source configuration of FIG. 7 can be used with single photodetector configuration shown in FIG. 5 without any loss of generality.

Figure 8:
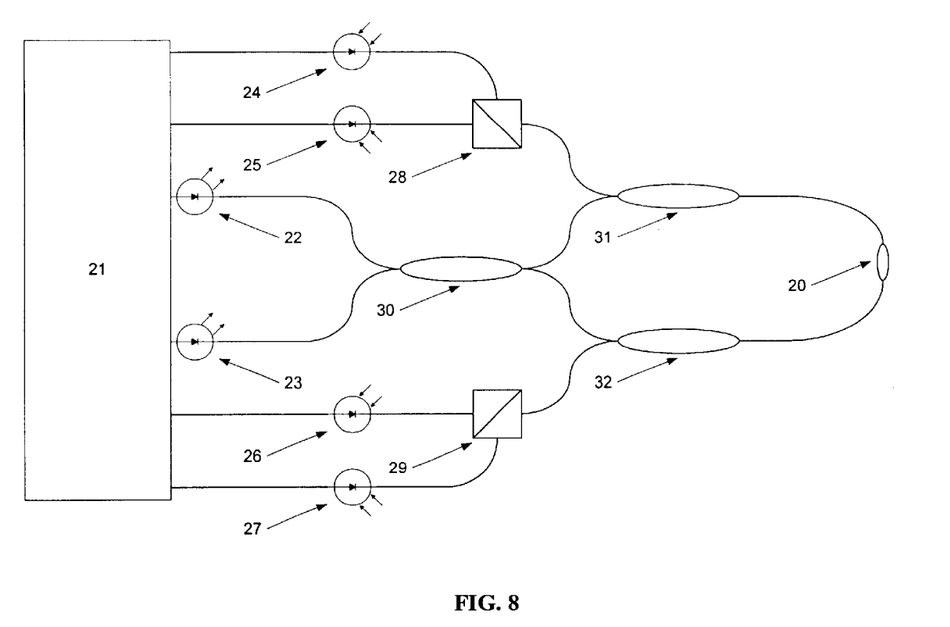
FIG. 8 shows a representative reciprocating path schematic used to process magnetic field and temperature information and is comprised of a semiconductor driver, two semiconductor sources, three optical couplers, the magneto-optic sensor assembly, dual beam splitters, four photodiodes, and signal processing electronics.

FIG. 8 shows a reciprocal transmissive electro-optical system capable of simultaneously measuring the polarization rotation of magneto-optical sensor assembly 20 due to the influence of magnetic fields and variations in temperature. Light energy is alternately generated by semiconductor light sources 22 and 23 and is coupled into the same transmission path is transmitted via an optical coupler 30. The optical coupler 30 is connected via optical fiber two additional couplers 31 and 32 that serve to establish the counter-propagating reciprocal structure through transducer assembly 20. In the presence of a magnetic field that has a field component oriented with the direction of the propagation of the optical wavefront, or in the presence of a temperature fluctuation affecting the Faraday rotator material 10, the intensity output of the transducer 20 will vary in proportion to the intensity of the magnetic field component or change in temperature of the Faraday rotator material 10. The output of transducer 20 is then sent back through optical couplers 31 and 32, where the optical energy is transmitted to polarizing beamsplitters 28 and 29 as appropriate. Polarizing beamsplitters 28 and 29 serve the purpose of separating the incident optical wavefront into two orthogonal components. The separated outputs of polarizing beamsplitter are then incident upon four independent photodiodes 24 through 27, which are then processed by analog or digital signal processing electronics 21.

The dual magnetic field and temperature analyzing function taught in FIGS. 7 and 8 can be separated as follows. Typically, Faraday rotators materials 10 are both temperature sensitive and wavelength sensitive. If Faraday rotator materials 10 that have a non-zero temperature coefficient are utilized in the transducer 20, then the Faraday rotation detected by a single photodiode 24 or by a pair of photodiodes 24 and 25 become a function of both temperature and magnetic field. The basic relationships governing this interaction are given by:

$$\Theta(\lambda_1) = C_1 \cdot dB + C_2 \cdot dT \qquad \text{EQN(1)}$$

$$\Theta(\lambda_2) = C_3 \cdot dB + C_4 \cdot dT \qquad \text{EQN(2)}$$

where $\Theta(\lambda_1)$ is the total rotation measured by the photodetectors 24/25 in single or combination at one particular wavelength $\lambda 1$;

$\Theta(\lambda_2)$ is the total rotation measured by the photodetectors 24/25 in single or combination at another particular wavelength $\lambda 2$;

dB is the desired change in magnetic flux component that contributed to the rotation $\Theta(\lambda 1)$ and $\Theta(\lambda 2)$;

dT is the desired change in temperature component that contributed to the rotation $\Theta(\lambda 1)$ and $\Theta(\lambda 2)$;

C1 and C2 are coefficients determined a priori that correspond to $\lambda 1$; and C3 and C4 are coefficients determined a priori that correspond to $\lambda 2$.

Once C1 through C4 have been characterized and the total rotation Θ(λ1, λ2) has been measured, the desired quantities dB and dT can be determined in real-time from:

$$dB = \frac{C_4\Theta(\lambda_1) - C_2\Theta(\lambda_2)}{C_1C_4 - C_2C_3} \quad \text{EQN. (3)}$$

$$dT = \frac{C_1\Theta(\lambda_2) - C_3\Theta(\lambda_1)}{C_1C_4 - C_2C_3} \quad \text{EQN. (4)}$$

This dual-functionality has tremendous utility in applications requiring both information concerning the local conductor temperature as well as the magnitude of the load current through the conductor being monitored.

Figure 9:
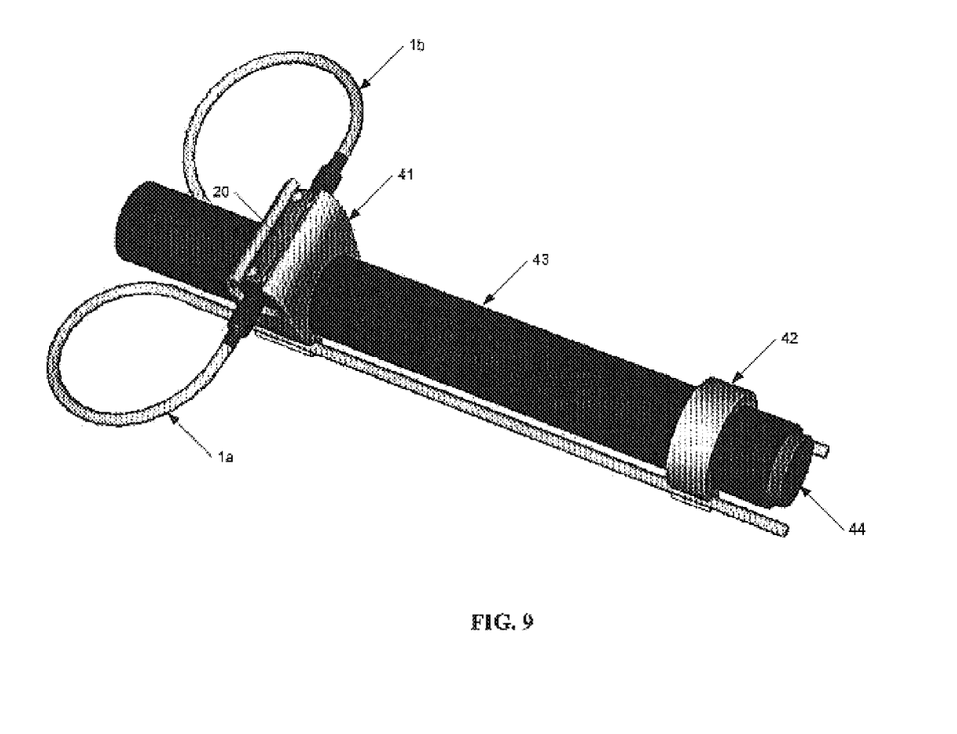
FIG. 9 shows the magneto-optic sensor assembly mounted on a circular cable.

FIG. 9 shows the optical current sensor assembly 20 mounted in a magneto-optical current sensor assembly holder 41 that is made to fit a given size of conductor, specifically the size of the outer insulting jacket 43 and inner metallic conductor 44. The holder 41 serves the purpose of specifically orienting the magneto-optic sensor assembly 20 such that the internal Faraday rotator material 10 of the sensor assembly 20 is located a fixed distance from the current carrying conductor 43/44 so that the magnetic field induced by the current carrying conductor 43/44 is exactly parallel to the propagating optical wavefront traveling through the Faraday rotator material 10. An additional purpose of holder 41 is to position the sensor assembly 20 in such a manner as not to cause the internal Faraday rotator material of 20 to not saturate. Another purpose of holder 41 is to provide a method so that the optical current sensor assembly 20 can be connected and disconnected from the current carrying conductor 43/44 easily, without disconnecting the conductor from the system and disrupting the current flow to the electrical load.

Fiber optic cable retainer 42 serves the purpose of dressing the furcation tubing 1a/1b that extends to and from the magneto-optical sensor assembly 20 so that the tubing 1a/1b containing optical fiber 5a/5b is somewhat protected and the effects of optical birefringence are lessened.

Further details of sensors which can be used in accordance with the principles taught herein are set forth in U.S. patent application Ser. No. 09/421,399 entitled "Methods and Apparatus for Optically Measuring Polarization Rotation of Optical Wavefronts Using Rare Earth Iron Garnets," and U.S. patent application Ser. No. 09/783,390 entitled "Fiber Optic Sensors And Methods Therefor," the entire disclosures of which are incorporated herein by reference. The sensor devices taught herein can be used in systems and methods such as those described in U.S. patent application Ser. No. 09/841,164 entitled "System and Method for Distributed Monitoring Using Remote Sensors," the entire disclosure of which is incorporated herein by reference. The sensor devices taught herein may be used, e.g., to monitor current and temperature, and/or to sense faults, in high-voltage power transmission and distribution lines, shipboard zonal power systems for monitoring load current and temperature, such as temperature of conductor and/or power panel, as well as load current through conductor and/or power panel. The sensors may also be used, e.g., in power inversion systems to provide intrinsic isolation between high-power and low-power control electronics, and may offer greater safety in such applications.

While the invention has been particularly shown and described with reference to a preferred embodiment thereof, it will be understood by those skilled in the art that various changes in form and details may be made therein without departing from the rit and scope of the invention.

The embodiments of the invention in which an exclusive property or privilege is claimed are defined as follows:

1. A magneto-optic sensor comprising:
   (a) a Faraday rotator material with a specified defect-free aperture area;
   (b) a rotationally symmetric cylindrical carrier with an internal Faraday rotator material retaining area sized to securely hold the Faraday rotator material and an exterior circumferential marking corresponding to the plane defined by the internal Faraday rotator material retaining area;
   (c) two spacers with minimum inner hole diameters corresponding to the aperture circular area of the Faraday rotator material;
   (d) two polarizing films such that the film aperture exceeds the defect free aperture area of the Faraday rotator material;
   (e) a rotationally symmetric retainer/adjuster assembly with a through center bore such that the bore diameter is greater than the defect free aperture area of the Faraday rotator material;
   (f) two angle-polished graded-index lens assemblies having diameters larger than the Faraday rotator material defect-free aperture area;
   (g) two optical fibers with a specified outer diameter;
   (h) two angle-polished capillary tubes such that the angle on a single capillary tube is a complimentary angle of the said graded index angle and such that the inner bore diameter matches the specified diameter of said optical fiber;
   (i) two hollow core tubes such that inner bore diameter matches the diameter of said graded index lens and said capillary tubes;
   (j) two collimator outer housings such that the inner diameter of the housings matches the outer diameter of said hollow care tubes;
   (k) a sensor housing with a through bore such that the inner diameter of the housing matches the outer diameter of the said collimator outer housings, and
   (l) that said sensor housing with a radial alignment hole located in a position corresponding to the positional center of the sensor housing, and
   (m) that said sensor housing has two sensor housing tensioning screws.

2. The magneto-optic sensor according to claim 1, wherein
   (a) said Faraday rotator material is positioned within the carrier so that the normal to the surface of the Faraday rotator material is parallel to the axis of rotation of the carrier;
   (b) said first spacer is positioned flush against the Faraday rotator material, and
   (c) that said second spacer is positioned flush against said carrier opposite said Faraday rotator material;
   (d) said first polarizing film is positioned within said first retainer/adjuster so that the normal to the surface of the contained first polarizing film is parallel to the axis of rotation of the first retainer/adjuster, and
   (e) that said first retainer/adjuster is positioned within the Faraday rotator carrier such that the first polarizing film is rotationally aligned with said Faraday rotator material such that maximum intensity of light is transmitted through the combination of the first polarizing film and said Faraday rotator material, and (f) that said second polarizing film is positioned within said second retainer/adjuster so that the normal to the surface of the contained second polarizing film is parallel to the axis of rotation of the second polarizing film, and (g) that said second retainer/adjuster is positioned within the Faraday rotator carrier such that the second polarizing film is rotationally aligned and offset by a fixed rotational angle φ (phi) with respect to said first polarizing film;

(h) said Faraday rotator carrier is positioned within said sensor housing such that said circumferential marking located on Faraday rotator carrier is visible through said radial alignment hole located on said sensor housing;

(i) said first optical fiber is contained in said first angle polished capillary tube, and (j) that said first angle-polished graded-index lens is rotationally aligned with said first angle polished capillary tube such that the two angled faces mate flush, and (k) that said first angle polished capillary tube and first angled-polished graded-index lens is axially positioned within said first hollow core tube, and (l) that said first hollow core tube is axially positioned within said first collimator outer housing, (m) that said first collimator outer housing is positioned flush against said propositioned Faraday rotator carrier within said sensor housing;

(n) said first sensor housing tensioning screw which is tightened to secure corresponding said first collimator outer housing;

(o) said second optical fiber is contained in said second angle polished capillary tube, and (p) that said second angle-polished graded-index lens is rotationally aligned with said second angle polished capillary tube such that the two angled faces mate flush, and (q) that said second angle polished capillary tube and second angled-polished graded-index lens is axially positioned within said second hollow core tube, and (r) that said second hollow core tube is axially positioned within said second collimator outer housing, (s) that said second collimator outer housing is positioned flush against said prepositioned Faraday rotator carrier within said sensor housing;

(t) said second sensor housing tensioning screw which is tightened to secure corresponding said second collimator outer housing.

3. The magneto-optic sensor according to claim 1, wherein said optical fiber is single mode optical fiber.

4. The magneto-optic sensor according to claim 1, wherein said optical fiber is polarization maintaining optical fiber.

5. The magneto-optic sensor according to claim 1, wherein said Faraday rotator material carrier is comprised of a low thermal resistance material.

6. The magneto-optic sensor according to claim 1, wherein said Faraday rotator material carrier is comprised of a high thermal resistance material.

7. The magneto-optic sensor according to claim 1, wherein said spacer is comprised of a high thermal resistance material.

8. The magneto-optic sensor according to claim 1, wherein said spacer is comprised of a low thermal resistance material.

9. The magneto-optic sensor according to claim 1, wherein said first or second polarizing film Polarcor.

10. The magneto-optic sensor according to claim 1, wherein said first or second retainer/adjuster is comprised of a low thermal resistance material.

11. The magneto-optic sensor according to claim 1, wherein said first or second retainer/adjuster is comprised of a high thermal resistance material.

12. The magneto-optic senior according to claim 1, wherein said first or second collimator outer housing is comprised of a low thermal resistance material.

13. The magneto-optic sensor according to claim 1, wherein said first or second collimator outer housing is comprised of a high thermal resistance material.

14. A magneto-optic sensor comprising:

(a) a Faraday rotator material with a specified defect-free aperture area, with a thin-film polarizer deposited on one side of said Faraday rotator material and a second thin-film polarizer deposited on the opposing side of the Faraday rotator;

(b) a rotationally symmetric cylindrical carrier with an internal Faraday rotator material retaining area sized to securely hold the Faraday rotator material and an exterior circumferential marking corresponding to the plane defined by the internal Faraday rotator material retaining area;

(c) two spacers with minimum inner hole diameters corresponding to the aperture circular area of the Faraday rotator material;

(d) two angle-polished graded-index lens assemblies such that the diameter of the assemblies is larger than the Faraday rotator material defect-free aperture area;

(e) two optical fibers with a specified outer diameter;

(f) two angle-polished capillary tubes such that the angle on a single capillary tube is a complimentary angle of the said graded index angle and such that the inner bore diameter matches the specified diameter of said optical fiber;

(g) two hollow core tubes such that inner bore diameter matches the diameter of said graded index lens and said capillary tubes;

(h) two collimator outer housings such that the inner diameter of the housings matches the outer diameter of said hollow core tubes;

(i) a sensor housing with a through bore such that the inner diameter of the housing matches the outer diameter of the said collimator outer housings, and (j) that said sensor housing with a radial alignment hole located in a position corresponding to the positional center of the sensor housing, and (k) that said sensor housing has two sensor housing tensioning screws.

15. The magneto-optic sensor according to claim 14, wherein (a) said first polarizing film is deposited upon first surface of said Faraday rotator material such that the first polarizing film is rotationally aligned with said Faraday rotator material such that maximum intensity of light is transmitted through the combination of the first polarizing film and said Faraday rotator material, and (b) that said second polarizing film is deposited on the Faraday rotator carrier such that the second polarizing film is rotationally aligned and offset by a fixed rotational angle φ (phi) with respect to said first polarizing film.

16. The magneto-optic sensor according to claim 14, wherein (a) said Faraday rotator material is positioned within the carrier so that the normal to the surface of the Faraday rotator material is parallel to the axis of rotation of the carrier;

(b) said first spacer is positioned flush against the Faraday rotator material, and (c) that said second spacer is positioned flush against said carrier opposite said Faraday rotator material;

(d) said Faraday rotator carrier is positioned within said sensor housing such that said circumferential marking located on Faraday rotator carrier is visible through said radial alignment hole located on said sensor housing;

(e) said first optical fiber is contained in said first angle polished capillary tube, and (f) that said first angle-polished graded-index lens is rotationally aligned with said first angle polished capillary tube such that the two angled faces mate flush, and (g) that said first angle polished capillary tube and first angled-polished graded-index lens is axially positioned within said first hollow core tube, and (h) that said first hollow core tube is axially positioned within said first collimator outer housing, (i) that said first collimator outer housing is positioned flush against said propositioned Faraday rotator carrier within said sensor housing;

(j) said first sensor housing tensioning screw which is tightened to secure corresponding said first collimator outer housing;

(k) said second optical fiber is contained in said second angle polished capillary tube, and (l) tat said second angle-polished graded-index lens is rotationally aligned with said second angle polished capillary tube such that the two angled faces mate flush, and (m) that said second angle polished capillary tube and second angled-polished graded-index lens is axially positioned within said second hollow core tube, and (n) that said second hollow core tube is axially positioned within said second collimator outer housing, (o) that said second collimator outer housing is positioned flush against said propositioned Faraday rotator carrier within said sensor housing;

(p) said second sensor housing tensioning screw which is tightened to secure corresponding said second collimator outer housing.

17. The magneto-optic sensor according to claim 14, wherein said optical fiber is single mode optical fiber.

18. The magneto-optic sensor according to claim 14, wherein said optical fiber is polarization maintaining optical fiber.

19. The magneto-optic sensor according to claim 14, wherein said Faraday rotator material carrier is comprised of a low thermal resistance material.

20. The magneto-optic sensor according to claim 14, wherein said Faraday rotator material carrier is comprised of a high thermal resistance material.

21. The magneto-optic sensor according to claim 14, wherein said spacer is comprised of a high thermal resistance material.

22. The magneto-optic sensor according to claim 14, wherein said spacer is comprised of a low thermal resistance material.

23. The magneto-optic sensor according to claim 14, wherein said first or second polarizing film Polarcor.

24. The magneto-optic sensor according to claim 14, wherein said first or second retainer/adjuster is comprised of a low thermal resistance material.

25. The magneto-optic sensor according to claim 14, wherein said first or second retainer/adjuster is comprised of a high thermal resistance material.

26. The magneto-optic sensor according to claim 14, wherein said first or second collimator outer housing is comprised of a low thermal resistance material.

27. The magneto-optic sensor according to claim 14, wherein said first or second collimator outer housing is comprised of a high thermal resistance material.

* * * * *

UNITED STATES PATENT AND TRADEMARK OFFICE
CERTIFICATE OF CORRECTION

PATENT NO. : 6,756,781 B2
DATED : June 29, 2004
INVENTOR(S) : Paul Grems Duncan and John Alan Schroeder

It is certified that error appears in the above-identified patent and that said Letters Patent is hereby corrected as shown below:

<u>Column 1,</u>
Line 8, please add the following sentences:

-- This invention was made with Government support under Grant No. DE-FG02-01ER831242 awarded by the Department of Energy. The Government has certain rights in this invention. --

Signed and Sealed this

Second Day of November, 2004

JON W. DUDAS
*Director of the United States Patent and Trademark Office*